United States Patent [19]

Kunugi et al.

[11] Patent Number: 4,644,292
[45] Date of Patent: Feb. 17, 1987

[54] AUTOMATIC GAIN AND FREQUENCY CHARACTERISTIC CONTROL UNIT IN AUDIO DEVICE

[75] Inventors: Yoshiro Kunugi; Makoto Odaka; Takeshi Sato; Yoshio Sasaki; Akio Tokumo, all of Saitama, Japan

[73] Assignee: Pioneer Electronic Corporation, Tokyo, Japan

[21] Appl. No.: 739,953

[22] Filed: May 31, 1985

[30] Foreign Application Priority Data

May 31, 1984 [JP] Japan .................................. 59-111837
Jul. 13, 1984 [JP] Japan .................................. 59-145591
Dec. 28, 1984 [JP] Japan .......................... 59-202034[U]

[51] Int. Cl.$^4$ ............................................. H03G 3/18
[52] U.S. Cl. ................................... 330/279; 330/149; 330/302
[58] Field of Search ................. 330/51, 107, 109, 149, 330/254, 278, 279, 284, 302, 305

[56] References Cited

U.S. PATENT DOCUMENTS

| 3,160,707 | 12/1964 | Meyers ................................. 330/149 |
| 3,452,282 | 6/1969 | Beres .................................. 330/278 X |
| 3,544,901 | 12/1970 | Wood ............................... 330/302 X |
| 4,019,160 | 4/1977 | Kam ................................... 330/302 X |
| 4,034,308 | 7/1977 | Wermoth et al. ................. 330/51 X |

FOREIGN PATENT DOCUMENTS 8118193 4/1983 France ............................... 330/278

Primary Examiner—Eugene R. Laroche
Assistant Examiner—Steven J. Mottola
Attorney, Agent, or Firm—Sughrue, Mion, Zinn, Macpeak & Seas

[57] ABSTRACT

An automatic gain control unit particularly adapted for vehicular use is disclosed. The ambient noise level inside the vehicle is detected, as is the level of the audio signal. A difference is formed between detection signals thus produced, and a frequency characteristic of a gain varying device, inserted in an audio signal path of the audio device, is varied according to this difference.

11 Claims, 25 Drawing Figures

AUTOMATIC GAIN AND FREQUENCY CHARACTERISTIC CONTROL UNIT IN AUDIO DEVICE

BACKGROUND OF THE INVENTION

The present invention relates to an automatic gain and frequency characteristic control unit in an audio device which automatically controls the amplification gain and frequency characteristic according to the level of external noise.

In an automobile, sound such as music outputted by an audio device is often masked by the ambient noise. In order to prevent such masking, an automatic gain control unit is available which can automatically control the amplification gain according to the level of the noise.

A conventional automatic gain control unit, as shown in FIG. 1, includes a noise detecting section 1-1 and a gain varying circuit 1-2. In the noise detecting section 1-1, external noise is picked up by a microphone 1-3, and the output signal of the microphone 1-3 is supplied through a microphone amplifier 1-4 to an LPF (low-pass filter) 1-5 which extracts only the noise band component. The output signal of the LPF 1-5 is rectified by a diode 1-6 and smoothed by a smoothing circuit 1-7, the output of which is supplied to a logarithmic compression circuit 1-8. The output signal of the logarithmic compression circuit 1-8 is supplied, as a gain control signal from the noise detecting section 1-1, to the gain varying circuit 1-2. The gain varying circuit 1-2 is implemented with an electronic volume control circuit, for instance. The gain varying circuit 1-2 is inserted in a signal line which transmits an audio signal from a tape deck or tuner to a power amplifier to thereby vary the amplification gain of the audio signal according to the output signal level of the logarithmic compression circuit 1-8. Accordingly, as the external noise level increases, the amplification gain of the audio signal is increased, and the acoustic level of the sound reproduced by the audio device is also increased.

In the case where the conventional automatic gain control unit is applied to an audio device mounted on a vehicle, as the noise level increases linearly (as indicated by the solid line a in FIG. 2) with the travel speed of the vehicle (noise level), the average volume level of a sound reproduced by the audio device is increased linearly (as indicated by the solid line b), thereby to prevent the masking phenomenon. In FIG. 2, the broken lines indicate the range in which the volume level varies.

In the conventional automatic gain control unit, gain control is carried out according to the noise level only, that is, it is performed independently of the audio signal level or dynamic range. In the case where the audio signal has a narrow dynamic range, the masking correction effect is sufficiently high. However, for music such as a symphony which has a wide dynamic range, the reproduced sound of the low level part of the audio signal is masked by noise as indicated by an arrow c in FIG. 2. If the gain is increased in such a manner that the reproduced sound of the lower level part of the audio signal is not masked by the noise, then the high level part of the audio signal becomes excessively large in volume.

In order to overcome this difficulty, an automatic gain control unit has been proposed which, as shown in FIG. 3, includes a noise detecting section 1-1, a gain varying circuit 1-2, a signal detecting section 1-9 and an arithmetic circuit 1-10. The noise detecting section 1-1 and the gain varying circuit 1-2 are the same as those in FIG. 1. In the signal detecting section 1-9, an audio signal supplied to the gain varying circuit 1-2 is rectified by a diode 1-11 and smoothed by a smoothing circuit 1-12, and the rectified voltage is subjected to a logarithmic compression by a logarithmic compression circuit 1-13 to provide a signal detection output. The arithmetic circuit 1-10 is composed of a multiplier 1-14 with which the output voltage of the signal detecting section 1-9 is multiplied by a voltage $V\alpha$ corresponding to a negative constant $\alpha$, an adder 1-15 for adding a voltage $V\beta$ corresponding to a positive constant $\beta$ to the output voltage of the multiplier 1-14, and a multiplier for obtaining the product of the output voltage of the adder 1-15 and the output voltage of the noise detecting section 1-1. The output of the multiplier 1-16 is supplied as a gain control signal to the gain varying circuit 1-12. The constant determines the increment in compression degree of an audio signal level with respect to an increment of a noise level; for instance $-0.04 < \alpha < 0$. The constant 62 determines an increment in gain of an audio signal reference level with respect to an increment of a noise level; for instance, $0 \leq \beta \leq 1$.

If it is assumed that, in the conventional automatic gain control unit thus constructed, a noise level increment with respect to a reference noise level, which is provided by the noise detecting section 1-1, is represented by $\Delta N$, and an audio signal level increment with respect to a reference signal level, which is provided by the signal detecting section, is represented by $\Delta S$, then the output voltage of the arithmetic circuit 1-10 is proportional to $\Delta N(\beta + \alpha \Delta S)$, and the gain $\Delta G(dB)$ of the audio signal by the gain varying circuit 1-2 is controlled so as to satisfy $\Delta G = \Delta N(\beta + \alpha \Delta S)$. That is, automatic volume control is carried out in such a manner that, as the audio signal level decreases, the gain is increased, and, as the audio signal level increases, the gain is decreased.

In the case where the above-described automatic gain control unit is applied to an audio device mounted on a vehicle, as the travel noise increases (as indicated by the solid line d in FIG. 4), similarly to the case of FIG. 2, the average volume level (the solid line e) of sound reproduced by the audio device is also increased with the noise level. The volume level variation range is decreased as the noise level increases, as indicated by the broken lines. This action prevents the difficulties that the low level part of the audio signal is masked by noise and the high level part is excessively high in volume. Thus, the reproduced sound is suitable in volume.

However, the conventional automatic gain control unit suffers from the problem that the reproduced sound may not always be satisfactory in hearing sensation.

Further, the invention relates to amplifier devices, and more particularly to an amplifier device in which the gain and the frequency characteristic can be changed simultaneously.

A conventional device of this type, as shown in FIG. 5, includes an electronic volume control circuit 2-1 which can vary a gain according to a control signal I, and a electronic tone control 2-2 which can increase or decrease the bass or treble frequencies in response to a control signal II. In the conventional amplifier device, when a signal is applied to an input terminal 2-3, the gain can be changed by the electronic volume control 2-1, and then the bass or treble frequencies can be adjusted by the electronic tone control 2-2.

The conventional amplifier device is disadvantageous in that the circuit is intricate because the device requires the gain controlling electronic volume and the bass and treble adjusting electronic tone control, and because the device must be provided with two control signal systems.

Still further, the invention relates to an automatic sound volume and frequency characteristic adjusting device which adjusts the sound volume and frequency characteristic of an audio device automatically according to the level of ambient noise around the audio device. More particularly, the invention relates to a noise correcting device which, according to the noise level in a vehicle, adjusts the sound volume and the sound frequency characteristic.

SUMMARY OF THE INVENTION

An object of this invention is to provide an automatic gain control unit which prevents sound masking caused by noise and which allows for the reproduction of sound of satisfactory in hearing sensation.

In accordance with the above and other objects, the invention provides an automatic gain and frequency characteristic control unit comprising noise detecting means for detecting the level of ambient noise around an audio device to provide a noise detection signal, signal detecting means for detecting an audio signal in the audio device to provide a signal detection signal corresponding to the level of the audio signal thus detected, subtracting means to provide the level difference signal between the noise detection signal and the signal detection signal, and gain varying means inserted in the audio signal line of the audio device to vary the frequency characteristic according to the output signal of the subtracting means.

Another object of the invention is to provide an amplifier device simple in arrangement which can change the gain and the frequency characteristic simultaneously.

In accordance with this object, the invention provides amplifier device comprising an operational amplifier to the noninverting input terminal of which a signal is applied; a first impedance circuit connected between the inverting input terminal and the output terminal of the operational amplifier; a second impedance circuit including series-connected time constant circuits, the second impedance circuit being connected between the inverting input terminal of the operational amplifier and a reference potential; and a plurality of switching elements connected between the reference potential and connecting points of the time constant circuits, the on-off operation of the switching elements being controlled to simultaneously change the gain and the frequency characteristic of the device.

Another object of the invention is to provide a noise correcting device capable of controlling a sound volume and a frequency characteristic so as to allow the natural reproduction of sound in hearing sensation, even when an audio signal which includes a large number of components in the lower frequency range or in the higher frequency range, is supplied.

Still another object of the invention is to provide a noise correcting device capable of preventing an occurrence of abrupt variation in the reproduction level of sound, which may be caused by an application of a pulsive signal representing sounds produced by a percussion instrument for instance Achieving this and other objects, the noise correcting device of the invention is so designed that, an audio signal is applied to a sigal level detecting unit through a filter whose characteristic is substantially equal to the human hearing characteristic. An example of such a filter is an A-weighted filter which is widely used in a sound level meter.

DESCRIPTION OF THE PREFERRED EMBODIMENTS

A first embodiment of the present invention will be described with reference to FIG. 6A.

Figure 6A:
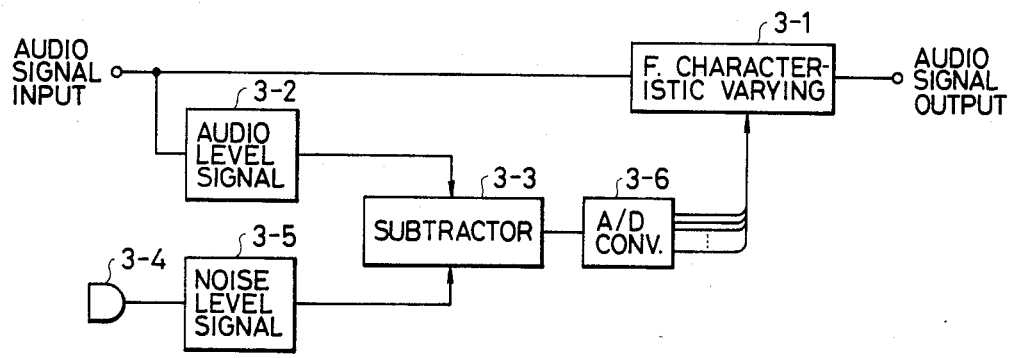
FIG. 6A is a block diagram showing a first embodiment of automatic gain and frequency characteristic control unit.

In FIG. 6A, an audio signal outputted by an audio device such as a tape deck or a tuner is supplied to a frequency characteristic varying circuit 3-1 and a level detecting circuit 3-2. The level detecting circuit 3-2 provides an audio level signal which is a DC level corresponding to the level of the audio signal applied thereto. The audio level signal is applied to the negative input terminal of a subtractor. The output of microphone 3-4 which picks up the noise in the vehicle is applied to a noise level detecting circuit 3-5. The noise level detecting circuit 3-5 provides a noise level signal which is a DC level proportional to the average value or effective value of the amplitude of the ambient noise. The noise level signal thus provided is applied to the positive input terminal of the subtractor 3-3. The subtractor 3-3 supplies an error signal to an A/D converter 3-6 indicative of the levels of the audio level signal and the noise level signal. The A/D converter 3-6 converts the error signal into a digital signal, which is applied as a control signal to the frequency characteristic varying circuit 3-1. In response to the control signal, the frequency characteristic varying circuit 3-1 changes the levels of predetermined frequency components of the audio signal. The audio signal thus treated is applied as an audio signal output to the following stage where, for instance, a power amplifier (not shown) is provided to drive a loudspeaker.

Figure 6B:
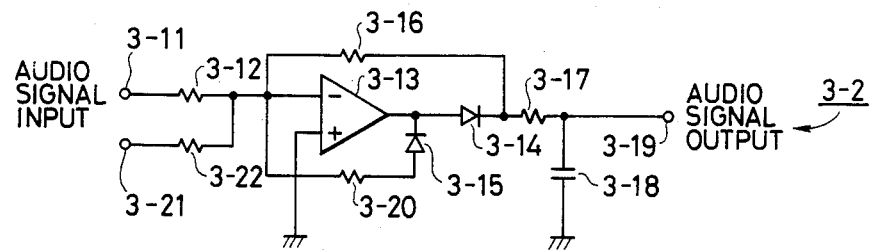
FIG. 6B is a circuit diagram of a level detecting circuit used in the device of FIG. 6A.

An example of the level detecting circuit 3-2 is as shown in FIG. 6B. In this figure, an audio signal is applied through an input terminal 11 and an input resistor 3-12 to the negative input terminal of a differential amplifier 3-13, the positive input terminal of which is grounded. The output terminal of the differential amplifier 3-13 is connected to the anode of a detecting diode 3-14 and the cathode of a detecting diode 3-15. The cathode of the diode 3-14 is connected to first terminals of resistors 3-16 and 3-17. The other terminal of the resistor 3-16 is connected to the negative input terminal of the differential amplifier 3-13. The other terminal of the resistor 3-17 is connected to one terminal of a capacitor 3-18 and an audio level signal output terminal 3-19. The other terminal of the capacitor 3-18 is grounded. The anode of the diode 3-15 is connected through a resistor 3-20 to the negative input terminal of the differential amplifiers 3-13. A second audio signal input terminal 3-21 is connected through a resistor 3-22 to the negative input terminal of the differential amplifier 3-13. The diodes 3-14 and 3-15 also have the same characteristics.

Figure 7:
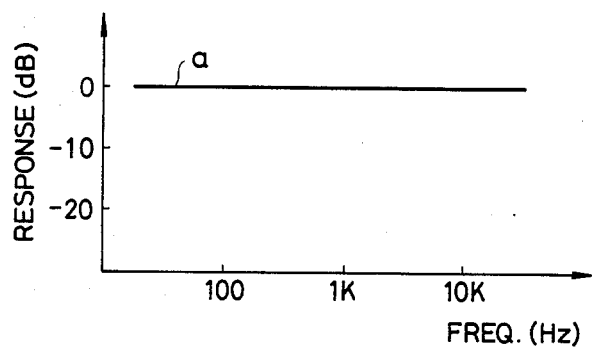
FIG. 7 is a graphical representation indicating the frequency versus response characteristic of the level detecting circuit shown in FIG. 6B.

In the circuit shown in FIG. 6B, the resistors 3-12, 3-16 and 3-20 determine the gain of the differential amplifier 3-13, the diodes 3-14 and 3-15 detect the output of the differential amplifier 3-13, and the resistor 3-17 and the capacitor 3-18 are used to smooth the detection output. In the case when the second audio signal is supplied, the gain of the differential amplifier 3-13 is determined by the resistors 3-22, 3-16 and 3-20. The response characteristic in a predetermined frequency range of the level detecting circuit is as indicated by the characteristic curve a in FIG. 7. As is apparent from FIG. 7, the characteristic curve a is substantially flat in the audio frequency range.

Figure 8:
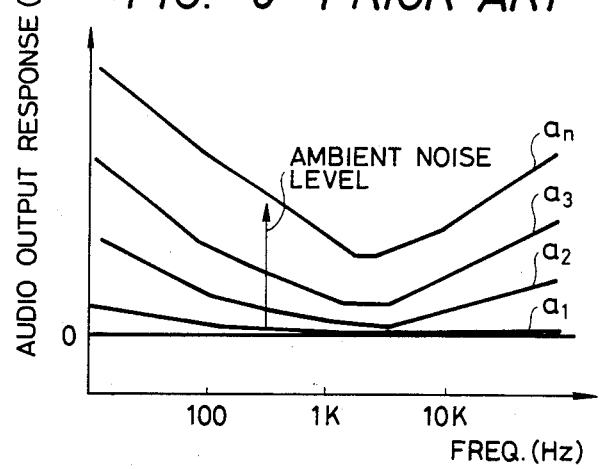
FIG. 8 is a graphical representation indicating the frequency versus response characteristics of a frequency characteristic varying circuit employed in the device of FIG. 6A.

The operation of the travel noise correcting device thus organized will be described. The noise in the vehicle is converted into an electrical signal by the microphone 3-4. The electrical signal is amplified by the noise level detecting circuit 3-5. The signal thus amplified is detected into a noise level signal proportional to the volume of the noise. The noise level signal is applied to the subtractor 3-3. The subtractor 3-3 outputs the error signal according to the noise level signal. The error signal is converted into a digital signal which is applied, as a control signal, to the frequency characteristic varying circuit 3-1. The frequency versus response characteristic of the circuit 3-1 is changed according to the control signal as shown in FIG. 8. For instance, as the value of the control signals increases to $a_1, a_2, a_3, \ldots$ and $a_n$ gradually, the frequency versus response characteristic of the frequency characteristic varying circuit 1 is changed successively as indicated by the characteristic curves $a_1, a_2, a_3, \ldots$ and $a_n$. The characteristic curve variation is effected so that, as the noise level increases, the responses in the low-frequency range and in the high-frequency range are increased (in corresponding with the sensitivity characteristics of the human ear). That is, as the ambient noise in the vehicle increases, the supplied audio signal is amplified according to the above-described characteristic to thus eliminate the difficulty that the desired sound is masked by noise.

Figure 9:
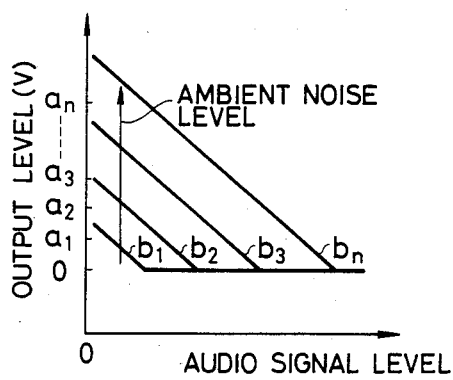
FIG. 9 is a graphical representation indicating the audio signal level versus output characteristics of a subtractor used in the device of FIG. 6A.

On the other hand, if, when the supplied audio signal is relatively high in level, the above-described operation were to be carried out, the sound volume would be excessively large or the output clipped by a protective circuit. Therefore, the subtractor 3-3 is provided with a function of increasing its output, namely, an error signal value, according to the noise level signal ($b_1, b_2, \ldots$ and $b_n$) supplied thereto and decreasing the output according to the audio level signal, as shown in FIG. 9.

Thus, the listener can satisfactorily hear music or the like in the vehicle.

A second embodiment of the invention will be described with reference to FIGS. 10 and 11.

Figure 1:
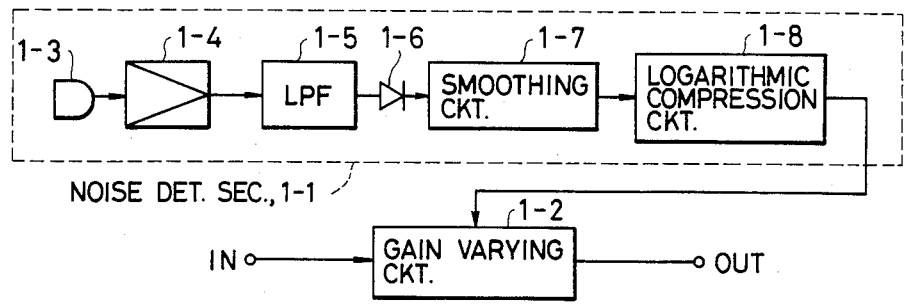
FIG. 1 is a block diagram showing a conventional automatic gain control unit.
Figure 2:
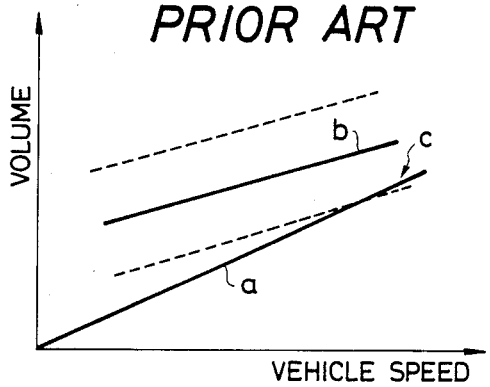
FIG. 2 is a diagram used for explaining the operation of the automatic gain control unit of FIG. 1.
Figure 4:
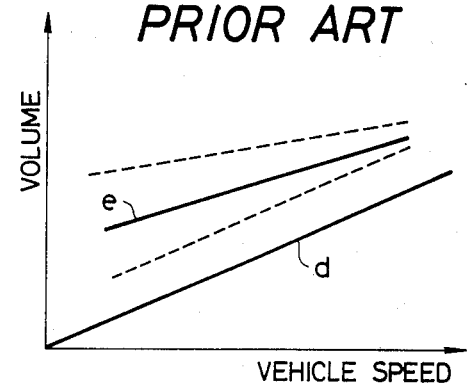
FIG. 4 is a diagram used for explaining the operation of the automatic gain control unit of FIG. 3.
Figure 10:
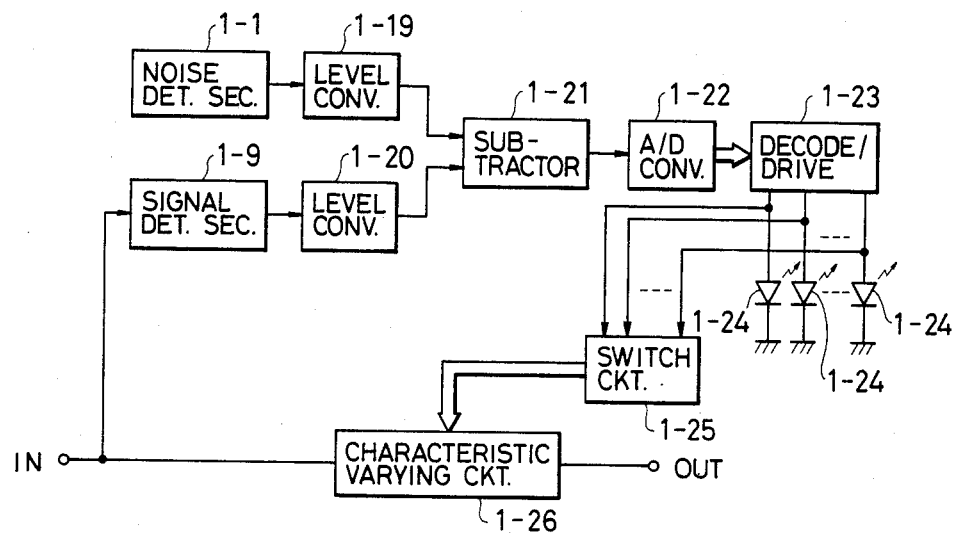
FIG. 10 is a block diagram showing another embodiment of an automatic gain and frequency characteristic control unit according to the invention.
Figure 11:
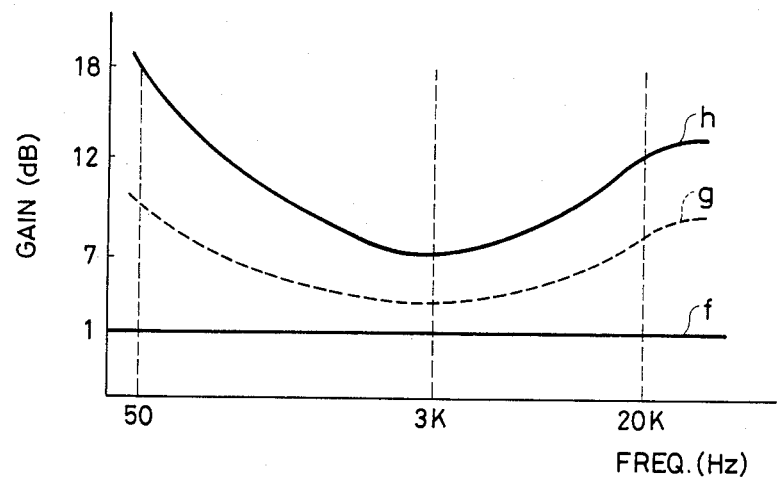
FIG. 11 is a characteristic diagram used for a description of the operation of the characteristic varying circuit employed in the automatic gain control unit of FIG. 10.

In FIG. 10, those components which have been previously described with reference to FIG. 1 are designated by the same reference numerals. The noise detecting section 1-1 and a signal detecting section are connected to level converters 1-19 and 1-20, respectively. The level converter 1-19 outputs a voltage 0.3 times as high as the output voltage of the noise detecting section, while the level converter 1-20 outputs a voltage 0.4 times as high as the output voltage of the signal detecting section 1-9. The level converters 1-19 and 1-20 are connected to a subtractor 1-21 with which the output voltages of the level converters 1-19 and 1-20 are subjected to subtraction. The output terminal of the subtractor 1-21 is connected through an A/D (analog-to-digital) converter 1-22 to a decoder/driver 1-23. The decoder/driver 1-23 has a plurality of output terminals which are connected to respective light-emitting diodes 1-24. The decoder/driver 1-23 converts a BCD (binary-coded decimal) code digital signal into a decimal code digital signal, the number of bits of which is equal to the number of the output terminals, and, according to the conversion result, drives the light-emitting diode 1-24 corresponding to the bit number. The output terminals of the decoder/driver 1-23 are connected through a switch circuit 1-25 to a characteristic varying circuit 1-26. The switch circuit 1-25 is composed of a plurality of transistors (not shown) which are turned on and off according to an output level of the decoder/driver 1-23. The frequency characteristic of the characteristic varying circuit 1-26 is changed according to the on-off operations of the transistors. The characteristic varying circuit 1-26 is inserted in the audio signal line of an audio device. The frequency characteristic is changed, for instance, by varying the constants of the gain varying circuit 1-2 shown in FIG. 1 or 3.

In the inventive automatic gain control unit thus constructed, a voltage $\Delta V_N$, corresponding to a noise level increment $\Delta N$, is supplied to the level converter 1-19 by the noise detecting section 1-1 so that the level converter 1-19 provides an output voltage $0.3 \Delta V_N$. On the other hand, a voltage $\Delta V_S$, corresponding to an audio signal level increment $\Delta S$, is applied to the level converter 1-20 by the signal detecting section 1-9 so that the level converter 1-20 provides an output level $0.4 \Delta V_S$. Therefore, the output voltage $V_G$ of the subtractor 21 is $0.3\Delta V_N - 0.4 \Delta V_S$. The output voltage $V_G$ is subjected to digital conversion by the A/D converter 1-22, the output of which is supplied to the decoder/-driver 1-23. Therefore, the light-emitting diodes 1-24 are turned on in a number proportional to the output voltage $V_G$.

According to the output of the decoder/driver 1-23, the transistors in the switch circuit 1-25 are turned on and off, thus determining the frequency characteristic of the characteristic varying circuit 1-26. When the audio signal level becomes higher than the reference voltage and the output voltage of the subtractor 1-21 becomes lower than a predetermined voltage, the gain established by the characteristic varying circuit 1-26 is a minimum and the frequency characteristic is flat, as indicated by the solid line f in FIG. 11. On the other hand, as the ambient noise level increases, the output voltage $V_G$ becomes higher than a predetermined voltage. In this case, as indicated by the broken line g in FIG. 11, the audio signal amplification gain established by the characteristic varying circuit 1-26 is increased, and the audio signal is boosted in both the low-frequency range and in the high-frequency range. When the audio signal is boosted at maximum, the gain is increased about 7 dB in the middle-frequency range around 3 KHz, about 18 dB at about 50 Hz, and about 12 dB at about 20 KHz.

In the noise detecting circuit 1-1, a time constant circuit is provided in the rear stage of the logarithmic compression circuit so that the signal rises slower than it falls. Furthermore, in the signal detecting section 1-9, the smoothing circuit is designed so that the signal rises faster than it falls. This is due to the fact that, if the audio signal level were to increase quickly and decrease gradually, reproduced sound is satisfactory in hearing sensation.

As in apparent from the above description, in the automatic gain control unit of the invention, not only the gain but also the reproduction frequency characteristic is changed according to the ambient noise level and the audio signal level, which prevents the difficulty that the reproduced sound is masked by the ambient noise and improves the acoustic sensation of the reproduced sound. In other words, when the audio signal is relatively strong, a natural sensation in hearing the reproduced sounds is attained, and when the noise level increases, the audio signal is emphasized, for instance, in the low-frequency range and in the high-frequency range. Therefore, the reproduced sound is made distinct from the ambient noise.

Figure 3:
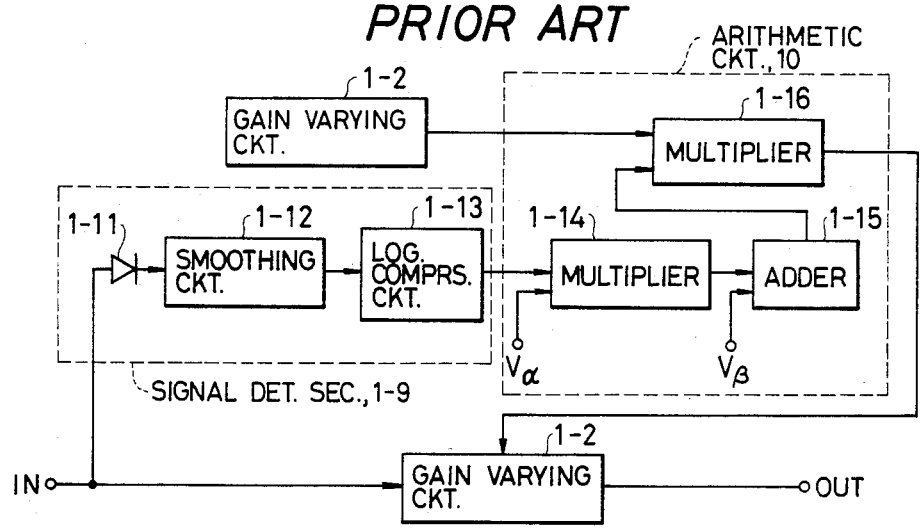
FIG. 3 is a block diagram of another conventional automatic gain control unit.

In the conventional automatic gain control unit shown in FIG. 3, depending on the value of the constant $\alpha$, when the noise level increases, sometimes the relation between the high and low levels of the audio signal is inverted and the high level audio signal gain becomes less than 0 dB. However, this difficulty is prevented according to the invention.

Figure 12:
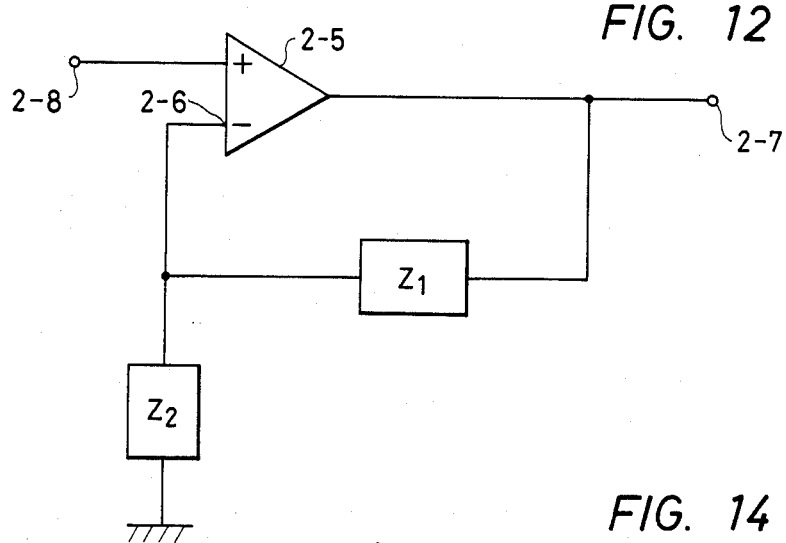
FIG. 12 is a block diagram of an amplifier device of the invention.

FIG. 12 is a circuit diagram showing an example of the characteristic varying circuit 1-26 shown in FIG. 10. This amplifier device includes an operational amplifier 2-5, the output terminal of which is connected through an impedance circuit $Z_1$ to its inverting input terminal 2-6. An impedance circuit $Z_2$ is connected between the inverting input terminal 2-6 and a reference potential, namely, ground potential. The noninverting input terminal 2-8 of the operational amplifier is used as the input terminal of the amplifier device. In this embodiment, the impedance of the impedance circuit $Z_2$ is changed to simultaneously change the gain and the frequency characteristic.

Figure 13:
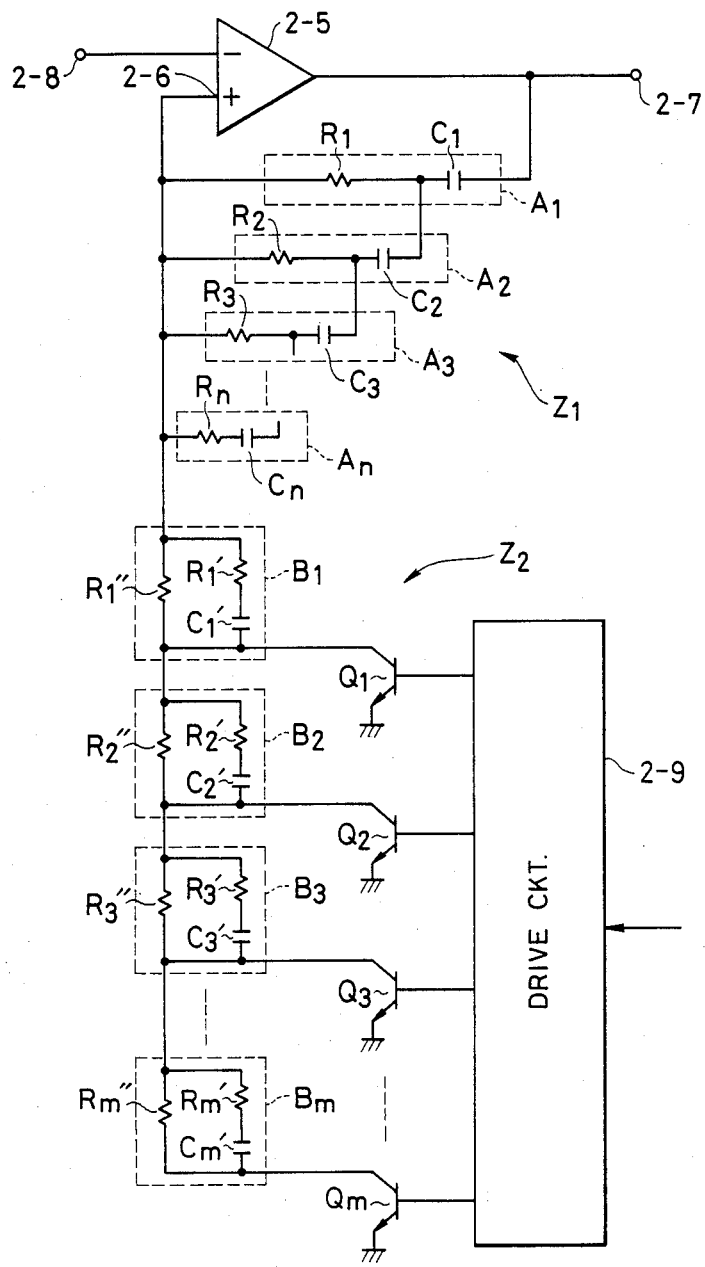
FIG. 13 is a circuit diagram of the amplifier depicted in block diagram form in FIG. 12.

FIG. 13 shows the circuit of the amplifier device in FIG. 12 in more detail. The impedance circuit $Z_1$ has a time constant circuit $A_1$ having a time constant $\tau_1$ connected between the inverting input terminal 2-6 and the output terminal 2-7 of the operational amplifier 2-5. The time constant circuit $A_1$ is made up of a series circuit of a resistor $R_1$ and a capacitor $C_1$. A time constant circuit $A_2$ having a time constant $\tau_2$ is connected between the terminals of the resistor $R_1$ in the time constant circuit $A_1$. Similarly as in the time constant circuit $A_1$, the time constant circuit $A_2$ is a series circuit of a resistor $R_2$ and a capacitor $C_2$. In the same manner, time constant circuits $A_3$, $A_4$, ... and $A_n$ having time constants $\tau_3$, $\tau_4$, ... $\tau_n$ are connected. The resistors in the time constant circuits $A_1$ through $A_n$ are, in general, high in resistance because it is necessary to apply direct current feedback and to make the gain in a very low-frequency characteristic constant.

Further, the impedance circuit $Z_2$ is composed of a series circuit of time constant circuits $B_1$, $B_2$, ... and $B_m$ having respective time constants $\tau_1'$, $\tau_2'$, ... and $\tau_m$. The time constant circuit $B_1$ includes a series circuit of a resistor $R_1'$ and a capacitor $C_1'$, and a resistor $R_1''$ connected in parallel with the series circuit. The time constant circuit $B_2$ is composed of a series circuit of a resistor $R_2'$ and a capacitor $C_2'$, and a resistor $R_2''$ connected in parallel with the series circuit. The time constant circuit $B_m$ includes a series circuit of a resistor $R_m'$ and a capacitor $C_m'$, and a resistor $R_m''$ connected in parallel with the series circuit.

The connecting points of the time constant circuits $B_1$, $B_2$, ... and $B_m$ are connected to the collectors of transistors $Q_1$, $Q_2$, ... and $Q_m$, respectively, the emitters of which are grounded. The bases of the transistors $Q_1$ through $Q_m$ are connected to a drive circuit 2-9. The time constant circuits $B_1$, $B_2$, ... and $B_m$ determine the gain in the middle-frequency range and the characteristic in the high-frequency range.

The operation of the amplifier device thus constructed will be described.

Figure 5:
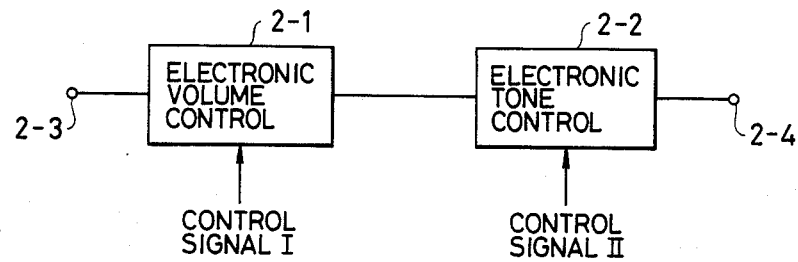
FIG. 5 is a block diagram showing a conventional amplifier circuit in which the gain and frequency characteristics can be changed simultaneously.
Figure 14:
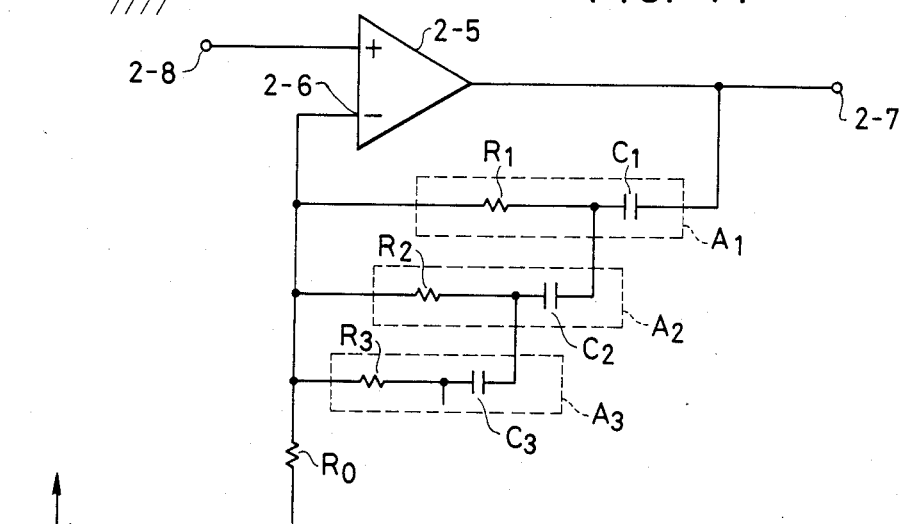
FIGS. 14, 15, 16, 17, 18A and 18B are diagrams used for explaining the operation of the amplifier of FIG. 12.
Figure 15:
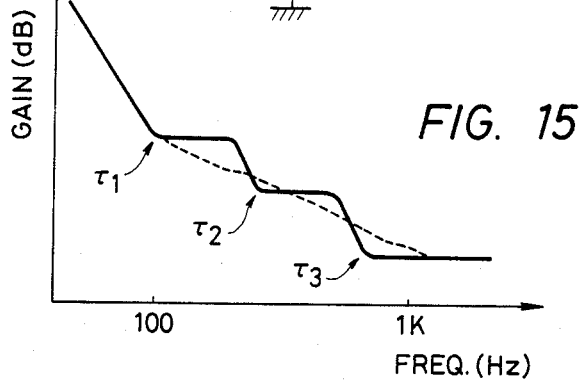

First, a characteristic imparted by the impedance circuit $Z_1$ will be described. The characteristic in the low-frequency range (lower than 2 to 3 KHz) is determined by the impedance circuit $Z_1$. It is assumed that the impedance circuit $Z_1$ is made up of the time constant circuits $A_1$, $A_2$ and $A_3$ only, and that the impedance circuit $Z_2$ is made up of the resistor $R_0$ only, as shown in FIG. 14. The time constant circuits $A_1$, $A_2$ and $A_3$ have the time constants $\tau_1$, $\tau_2$ and $\tau_3$, respectively. These time constants relate to the gain and the frequency characteristic as shown in FIG. 15. In the frequency range lower than 100 Hz, the characteristic is raised at a rate of 6 dB/octave. In the frequency range of 100 Hz to 1 KHz, two time constants ($\tau_2$ and $\tau_3$) exist, and therefore the characteristic is of 2 to 3 dB/octave (as indicated by the broken line in FIG. 5). If, in the circuit of FIG. 14, the resistor $R_0$ has a considerably small resistance value and the gain is sufficiently high, in the frequency range lower than 100 Hz, a characteristic of 6 dB/octave is obtained; that is, the characteristic curve becomes ideal as a whole. If the resistance of the resistor $R_0$ is increased and the gain is decreased as a whole, then the characteristic curve in the frequency range lower than 1 KHz has a small inclination; that is, the characteristic curve is made gradually flat.

Figure 16:
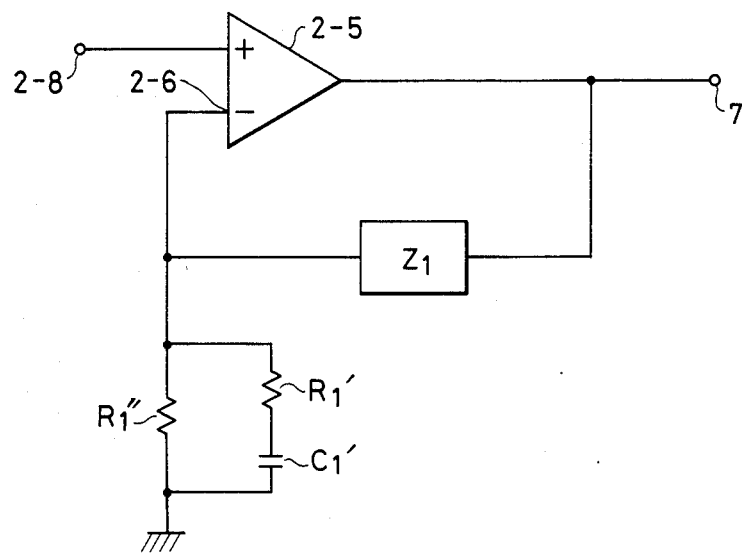
Figure 17:
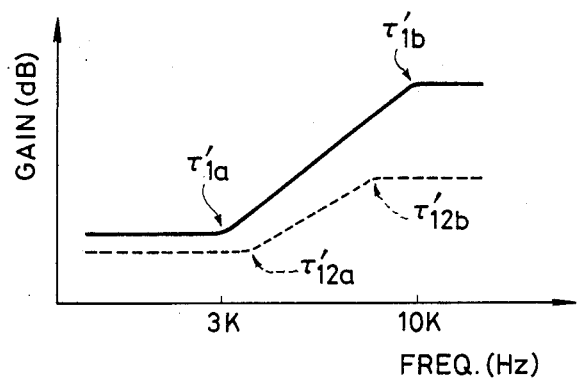

The characteristic imparted by the impedance circuit $Z_2$ will be described. When the transistor $Q_1$ is rendered conductive, the circuit of the amplifier device becomes equivalent to that shown in FIG. 16. If the time constant determined by the resistor $R_1'$ and the capacitor $C_1'$ in the time constant circuit $B_1$ is represented by $\tau'_{1a}$ and the time constant determined by the resistor $R_1''$ and the capacitor $C_1'$ is represented by $\tau'_{1b}$, the characteristic in the high-frequency range is determined by the time constants as indicated by the solid line in FIG. 17.

Figure 18A:
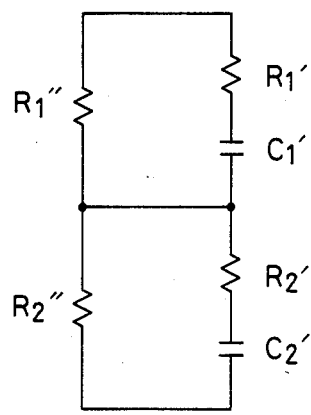
Figure 18B:
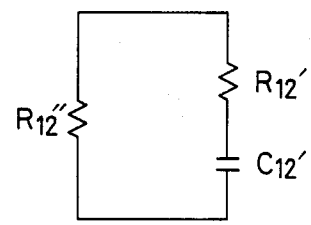

When the transistor $Q_2$ is rendered conductive, the impedance circuit $Z_2$ becomes equal to that which is indicated in FIG. 18A. FIG. 18B shows a circuit which is equivalent to the circuit shown in FIG. 18A. The equivalent circuit is made up of a series circuit of a resistor $R_{12}'$ and a capacitor $C_{12}'$, and the resistor $R_{12}''$ connected in parallel with the series circuit. If the time constant determined by the resistor $R_{12}'$ and the capacitor $C_{12}'$ in the equivalent circuit is represented by $\tau'_{12a}$ and the time constant determined by the resistor $R_{12}''$ and the capacitor $C_{12}'$ is represented by $\tau'_{12b}$, then a flat characteristic is obtained as indicated by the broken line in FIG. 17 which is more gentle in inclination than that indicated by the solid line. That is, when the transistor $Q_2$ is turned on, the time constant $\tau'_{1a}$ is shifted higher, to $\tau'_{12a}$, and the time constant $\tau_{1b}$ is shifted lower, to $\tau_{12b}$.

Figure 19:
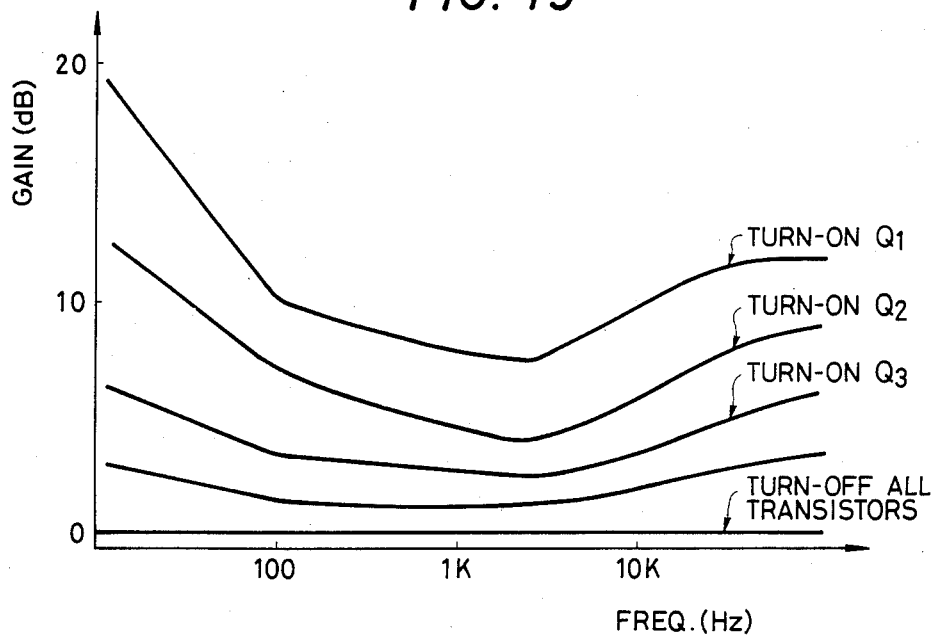
FIG. 19 is a diagram showing the gain and frequency characteristics of the embodiment of FIG. 13.

The effects of the impedance circuits $Z_1$ and $Z_2$ on the characteristic have been described. FIG. 19 shows variations in the gain and frequency characteristics of the amplifier device.

When the transistor $Q_1$ is rendered conductive by the drive circuit 2-9, the amplifier device is then formed of the operational amplifier 2-5, the time constant circuit $A_1$ through $A_n$, and the time constant circuit $B_1$ (the remaining circuits being inactive), and the characteristic in the high-frequency range (higher than 2 KH) is determined by the time constants of the time constant circuit $B_1$, as described above. That is, the frequency characteristic in which the gain is increased is substantially determined by the resistor $R_1'$ and the capacitor $C_1'$ in the time constant circuit $B_1$, and the frequency characteristic whereby an increase of the gain is prevented is substantially determined by the resistor $R_1''$ and the capacitor $C_1'$. In the low-frequency range, as described above, the frequency characteristic lower than the time constant $\tau_1$ of the time constant circuit $A_1$ is raised at a rate of 6 dB/octave. The frequency characteristic higher than that defined by the time constant $\tau_1$ is raised, for instance, at a rate of 3 dB/octave or 2 dB/octave owing to the time constant $\tau_2$ of the time constant circuit $A_2$ and the time constant $\tau_3$ of the time constant circuit $A_3$. In higher frequency ranges, the gain becomes constant.

When the transistor $Q_1$ is turned off and the transistor $Q_2$ is turned on, the amplifier device is formed of the operational amplifier 2-5, the time constant circuits $A_1$, $A_2$, ... and $A_n$, and the time constant circuits $B_1$ and $B_2$. In the amplifier circuit so configured the gain in the middle-frequency range is decreased, while the gain in the high- and low-frequency ranges is also decreased, as described above. The frequency characteristic in which the gain is increased and the frequency characteristic in which the gain is constant are the same as those in the case where the transistor $Q_1$ is rendered conductive.

When the transistors $Q_1$ and $Q_2$ are rendered nonconductive while the transistor $Q_3$ is rendered conductive, the gain in the middle-frequency range is further decreased, and the gain frequency characteristic is gradually made flat.

When all the transistors $Q_1$ through $Q_m$ are rendered nonconductive (off), the inverting input terminal 2-6 of the operational amplifier 2-5 is electrically disconnected from the ground. Therefore, the operational amplifier 5 operates as buffer amplifier, as a result of which the amplifier device has a gain of about 0 dB and a flat frequency characteristic.

As is apparent from the above description, in this embodiment of the invention, the gain and the frequency characteristic can be simultaneously changed by controlling the on-off operations of the transistors $Q_1$ through $Q_m$.

Figure 20:
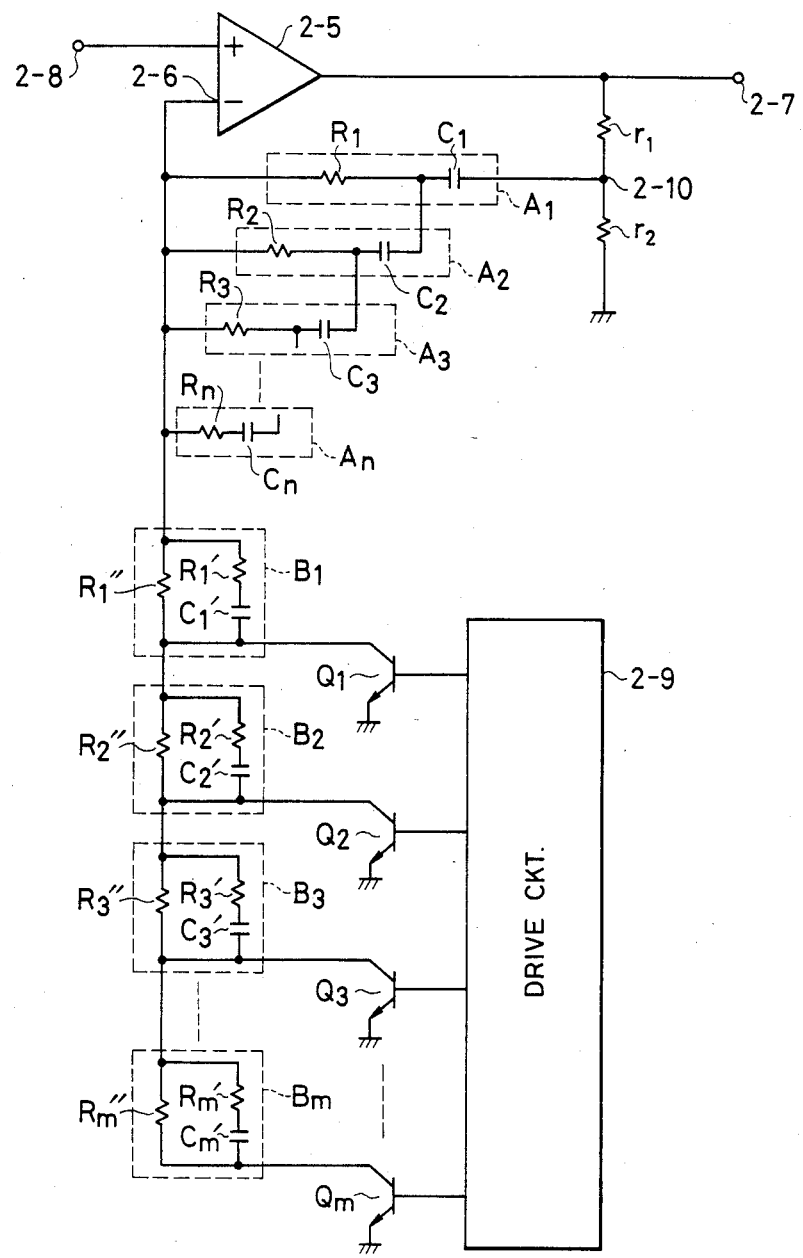
FIG. 20 is a circuit diagram of further embodiment of an amplifier device of the invention.

In the embodiment of the invention shown in FIG. 13, the time constant circuits $A_1$ through $A_n$ are directly connected between the inverting input terminal 2-6 and the output terminal of the operational amplifier 2-5. However, the amplifier device may be modified so that, as shown in FIG. 20, a voltage dividing circuit consisting of resistors $r_1$ and $r_2$ is connected between the output terminal 2-7 and ground, and the voltage division point 2-10 is connected to the time constant circuit. In this case, the resistance of each of the resistors $r_1$ and $r_2$ should be lower than that of any one of the resistors in the time constant circuits $A_1$ through $A_n$. In the amplifier device thus constructed, even if all the transistors $Q_1$ through $Q_m$ are turned off, the gain will not become 0 dB, i.e., a flat gain of $(1+r_1/r_2)$ is maintained.

In the above-described embodiments of the invention, the transistors are connected to the time constant circuits $B_1$ through $B_m$. However, it should be noted that the invention is not limited thereto or thereby. That is, the transistors may be released by any switching elements which can perform on-off operations.

According to the invention, the first impedance circuit including the time constant circuits is connected between the inverting input terminal and the output terminal of the operational amplifier, and the second impedance circuit including the series-connected time constant circuits is connected to the inverting input circuit. The connecting points of the time constant circuits in the second impedance circuit are connected through the switching elements to the reference potential. By controlling the on-off operations of these switching elements, the time constant is changed while the resistance in the D.C. mode is changed. Therefore, the gain and the frequency characteristic can be changed.

Figure 21:
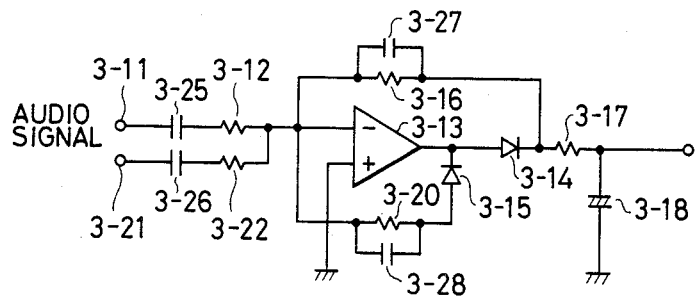
FIG. 21 is a diagram showing a level detecting circuit of the invention.

In an embodiment of the invention shown in FIG. 21, the level detecting circuit 3-2 in the conventional device shown in FIG. 6A is modified as shown in the drawing. The level detecting circuit according to the invention will be described with reference to FIG. 21. In FIG. 21, circuit elements corresponding functionally to those described with reference to FIG. 6B are designated by corresponding reference numerals. Only circuit elements different from those in FIG. 6B will be described.

A high-pass capacitor 3-25 is connected between the signal input terminal 3-11 and the input resistor 3-12. Similarly, a high-pass capacitor 26 is connected between the signal input terminal 3-21 and the input resistor 3-22. The high-pass capacitors 3-25 and 3-26 attenuate the low-frequency component of the audio signal. Capacitors 3-27 and 3-28 are connected in parallel with the resistors 3-16 and 3-20, respectively. The capacitors are used to attenuate the high-frequency component of the audio signal. The capacitors 3-27 and 3-28 have equal characteristics. The remaining arrangement of the circuit is the same as that of the conventional circuit of FIG. 6B.

Figure 22:
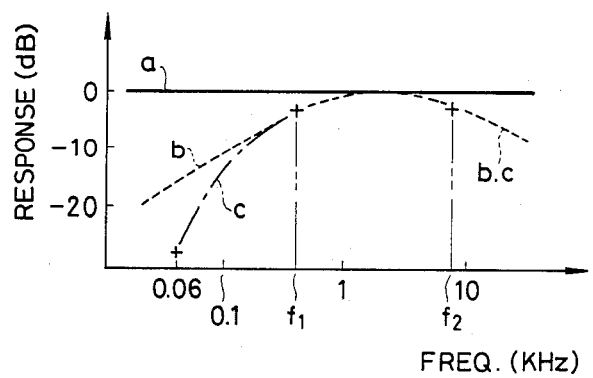
FIG. 22 is a graphical representation indicating the characteristic curves of filters employed in the circuit of FIG. 21.

The level detecting circuit will be further described with reference to FIG. 22. The frequency versus response characteristic of the above-described circuit according to the invention is indicated as a characteristic curve b in FIG. 22. The lower limit frequency $f_1$ of the characteristic curve is substantially:

$$f_1 = (\tfrac{1}{2}\pi)R_1 C_1,$$

where $R_1$ is the resistance of the input resistor 3-12, and $C_1$ is the capacitance of the high-pass capacitor 3-25. This can be applied to the other audio signal input terminal side. On the other hand, the upper limit frequency $f_2$ is substantially:

$$f_2 = (\tfrac{1}{2}\pi)R_2 C_2,$$

where $R_2$ is the resistance of the resistor 3-16 and $C_2$ is the capacitance of the capacitor 3-27. In the characteristic curve b, the frequencies $f_1$ and $f_2$ are 600 Hz and 8 KHz, respectively.

Figure 23:
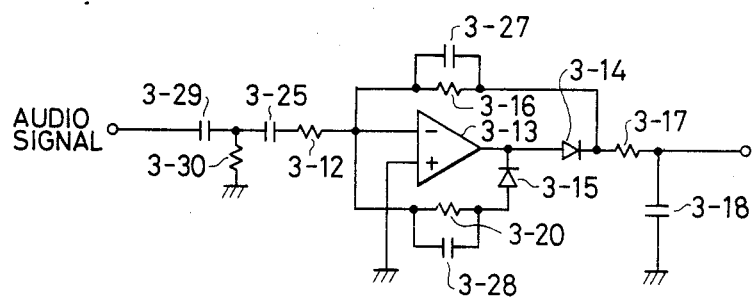
FIG. 23 is a circuit diagram of a level detecting circuit constructed in accordance with further embodiment of the invention.

FIG. 23 shows a level detecting circuit of another embodiment of the invention. In this embodiment the frequency versus response characteristic is substantially in correspondence to that of an electrical filtering network used in a so-called A weighted sound level meter. The circuit in FIG. 23 is different that in FIG. 21 in that a high-pass capacitor 3-29 is connected between the audio signal input terminal 11 and the high-pass capacitor 3-25 and the connecting point of the high-pass capacitors 3-25 and 3-29 is grounded through a resistor 3-30. The other arrangement is the same as that of FIG. 21. That is, the high-pass filter is employed as a secondary device and the low-pass filter is employed as a primary device to obtain an A weighted characteristic curve c as shown in FIG. 22. In the characteristic curve c, the lower limit frequency $f_1$ at which the curve is lowered by 3 dB is 600 Hz, and the frequency at which it is lowered by 28 dB is 60 Hz. The upper limit frequency $f_2$ on the high-frequency side is 8 KHz.

The frequency versus response characteristic of the level detecting circuit 3-2 is described above. With this characteristic, the low-frequency component and the high-frequency component of the supplied audio signal are sufficiently attenuated so that only the frequency range in which the audio signal can be satisfactorily heard is converted into the audio level signal which is supplied to the subtractor 3-3. The subtractor 3-3 and the circuit elements following the subtractor are equal in arrangement to those in the conventional device, and accordingly operate in the same manner to adjust the sound volume and sound frequency characteristic.

Effects similar to those described above maybe obtained by employing a high-pass filter instead of the above-described bandpass filter.

As is apparent from the above description, in the travel noise correcting device according to the invention, a filter circuit whose characteristic is substantially equal to the characteristic of an A-weighted filter widely used in a sound level meter, is provided in the level detecting circuit 3-2. Therefore, even when the supplied audio signal includes a large number of components in the lower-frequency range or in the higher-frequency range, or when such a pulsive signal as that representing a drum sound or a cymbal sound, which is high as an electric signal but not strong as hearing perception, occurs in the applied audio signal, the sound volume and sound frequency characteristic are always kept in a natural condition.

We claim:

1. An automatic gain and frequency characteristic control unit, comprising:
   noise detecting means for detecting ambient noise around an audio device to provide a noise detection signal;
   signal detecting means for detecting an audio signal in said audio device to provide a signal detection signal corresponding to the level of said audio signal thus detected;
   subtracting means for detecting a level difference between said noise detecting signal and said signal detection signal; and
   gain and frequency characteristic varying means inserted in an audio signal path of said audio device to vary gain and a frequency characteristic of selected components of said audio signal according to an output signal of said subtracting means, different ones of said selected components having their frequency characteristics varied to different degrees.

2. An amplifier device, comprising:
   an operational amplifier having inverting and noninverting input terminals and to the noninverting input terminal of which a signal is applied;
   a first impedance circuit connected between said inverting input terminal and an output terminal of said operational amplifier;
   a second impedance circuit including series-connected time constant circuits, the second impedance circuit being connected between said inverting input terminal of said operational amplifier and a reference potential; and
   a plurality of switching elements connected respectively between connecting points of said time constant circuits and said reference potential,
   wherein on-off operations of said switching elements are controlled to simultaneously change a gain and a frequency characteristic of the amplifier device.

3. The amplifier device as claimed in claim 2, wherein each of the time constant circuits of said second impedance circuit comprises a series circuit of a resistor and a capacitor, and a resistor connected in parallel with said series circuit.

4. The amplifier circuit as claimed in claim 3, wherein said first impedance circuit comprises:
   a voltage dividing circuit connected between said output terminal of said operational amplifier and said reference potential; and
   a plurality of time constant circuits connected between said inverting input terminal of said operational amplifier and a voltage division point of said voltage dividing circuit.

5. An automatic gain and frequency control unit, comprising:
audio signal level detecting means for detecting a signal level of an audio signal through a filter to produce an audio level signal according to the signal level thus detected;
noise level detecting means for providing a noise level signal according to the level of noise in a vehicle;
control means for providing a control signal according to said audio level signal and said noise level signal; and
gain and frequency characteristic varying means responsive to said control signal for selectively emphasizing frequency components to different degrees in said audio signal.

6. The unit as claimed in claim 5, wherein said filter comprises at least one of a high-pass filter and a band-pass filter.

7. The unit as claimed in claim 5, wherein said filter has a frequency versus attenuation characteristic corresponding to an weighted characteristic of a sound meter.

8. An audio signal processing circuit for processing an input audio signal for production by an audio device, said circuit comprising:
noise detecting means for detecting ambient noise around said audio device to provide a noise detection signal;
signal detecting means for detecting an audio signal in said audio device to provide a signal detection signal corresponding to the level of said audio signal thus detected;
means for combining said noise detection signal and said signal detection signal to generate a control signal; and gain and frequency characteristic varying means responsive to said control signal for changing the levels of predetermined frequency components of said input audio signal to different degrees within said input audio signal.

9. An audio signal processing circuit as claimed in claim 8, wherein said frequency characteristic varying means comprises an operational amplifier having a gain-determining circuit for determining the gain thereof, said gain-determining circuit including a plurality of RC circuits and switch means responsive to said control signal for connecting a selected number of said RC circuits in series with one another.

10. An audio signal processing circuit as claimed in claim 9, wherein said gain-determining circuit comprises a first impedance circuit connected between an output and an inverting input of said operational amplifier, and a second impedance circuit connected between said inverting input and a reference potential, said second impedance circuit comprising said selected number of series-connected RC circuits.

11. An audio signal processing circuit as claimed in claim 8, wherein said frequency characteristic varying circuit emphasizes high-frequency and low-frequency ranges of said input audio signal more than a center frequency range between said high and low frequency ranges, when the level of detected noise becomes high in relation to the level of the detected audio signal.

* * * * *